United States Patent [19]
Vaisanen

[11] Patent Number: 5,519,885
[45] Date of Patent: May 21, 1996

[54] METHOD TO GENERATE DIFFERENT FREQUENCY SIGNALS IN A DIGITAL RADIO TELEPHONE

[75] Inventor: Risto Vaisanen, Salo, Finland

[73] Assignee: Nokia Mobile Phones Ltd., Salo, Finland

[21] Appl. No.: 221,537

[22] Filed: Mar. 31, 1994

Related U.S. Application Data

[63] Continuation of Ser. No. 968,167, Oct. 29, 1992, abandoned.

[30] Foreign Application Priority Data

Nov. 5, 1991 [FI] Finland .................................... 915220

[51] Int. Cl.$^6$ ...................................................... H04B 1/40
[52] U.S. Cl. ................................................. 455/76; 455/86
[58] Field of Search .................................. 455/78, 75, 76, 455/84, 86, 142, 180.1, 180.2, 183.1, 188.1, 188.2, 189.1, 190.1, 207, 314, 177.1, 266, 340, 339, 54.1, 338, 83; 375/219; 379/58

[56] References Cited

U.S. PATENT DOCUMENTS

| | | | |
|---|---|---|---|
| 4,035,727 | 7/1977 | Ishii ........................................... | 455/76 |
| 4,223,406 | 9/1980 | Someno ................................ | 455/180.1 |
| 4,476,575 | 10/1984 | Franke et al. .............................. | 455/76 |
| 4,703,520 | 10/1987 | Rozanski, Jr. et al. ..................... | 455/76 |
| 4,723,306 | 2/1988 | Fuenfgelder et al. .................... | 455/103 |
| 4,969,210 | 11/1990 | Hansen et al. ........................... | 455/260 |
| 5,023,939 | 6/1991 | Hori ......................................... | 455/340 |
| 5,142,551 | 8/1992 | Borth et al. .............................. | 375/219 |

FOREIGN PATENT DOCUMENTS

| | | | |
|---|---|---|---|
| 0398688 | 11/1990 | European Pat. Off. ......... | H04Q 7/00 |
| 0415502A2 | 3/1991 | European Pat. Off. ......... | H04Q 7/04 |
| 2120906 | 12/1983 | United Kingdom ............. | H03D 7/16 |

OTHER PUBLICATIONS

Daroff, IEEE vol. CE23, Nov. 1977, pp. 518–521.
Wally H. W. Tuttlebee: "Cordless Telecommunications in Europe", May 1990, Springer–Verlag, London, p. 241, line 29–line 44.

Primary Examiner—Reinhard J. Eisenzopf
Assistant Examiner—Nguyen Vo
Attorney, Agent, or Firm—Perman & Green

[57] ABSTRACT

A method of generating the different frequency signals required in transmission and reception in a digital radio telephone for operation on at least two different frequency bands. According to the method the mixing frequencies (F1, F2) are selected so that from the frequencies obtained as the mixing results it will always be possible to select the intermediate frequencies (IF1, IF2) required in reception and the transmission frequency (FTX) required in transmission for a radio telephone operating on the desired frequency band.

2 Claims, 1 Drawing Sheet

METHOD TO GENERATE DIFFERENT FREQUENCY SIGNALS IN A DIGITAL RADIO TELEPHONE

This is a continuation of application Ser. No. 07/968,167 filed on Oct. 29, 1992, now abandoned.

The present invention relates to a method, in which the different frequency signals required for transmission and reception in a digital radio telephone operating on at least two different frequency bands can be generated using mixers.

BACKGROUND OF THE INVENTION

It is known to use a basic oscillator and one or more frequency synthesizers to generate stable local oscillator frequencies for the modulator of the transmitter and for the demodulator of the receiver. For the reception a mixing frequency is formed, with which the received RF signal is shifted to the intermediate frequency, and for the transmission a mixing frequency is formed, with which the intermediate frequency is raised to the transmission frequency. In systems where the difference of the intermediate frequencies used for transmission and reception equals the duplex interval it is possible to use the same mixing frequency for the transmitter and the receiver, and thus in such systems only one synthesizer is required to generate the mixing frequencies. The mixing frequency here relates basically to the signal supplied to the local oscillator port of the mixer, of the modulator, or of the demodulator. In system where the difference of the intermediate frequencies used for transmission and reception is not equal to the duplex interval at least two synthesizers are required to generate the mixing frequencies for the transmitter and the receiver.

Different systems use different frequency bands and so for systems operating on these different frequency bands there has to be synthesizers supplying different frequencies. Thus it is necessary to construct and manufacture different circuits to generate the required frequencies for mobile phones of different systems. For example, manufacturers of mobile phones intended for the GSM (Groups Special Mobile) and PCN (Personal Communications Network) mobile phone systems have to manufacture different RF parts for the GSM and PCN telephones, although the systems are generally similar digital cellular radio systems, except that the GSM operates on the 900 MHZ frequency band and the PCN on the 1800 MHz frequency band. Design and manufacture of different circuits is expensive, because the RF parts of radio telephones comprise several hundred components. Further the size of the batch to be produced will affect the circuit price in that in a smaller batch the unit price of the circuits will be higher than in a large batch.

SUMMARY OF THE INVENTION

According to a first aspect of the present invention there is provided a method of generating signals of different frequencies required in the processing of a signal received in a digital radio telephone for operation in at least two different frequency bands, characterized by, producing a first signal ($F_1$) of a first frequency and producing a second signal ($F_2$) of a second frequency, conveying the received signal (FRX) to a first mixer, wherein the received signal is mixed with said first signal ($F_1$), selecting a signal at a desired frequency as the first intermediate frequency signal ($IF_1$) from the first mixer, conveying the first intermediate frequency signal ($IF_1$) to a second mixer, wherein the first intermediate frequency signal ($IF_1$) is mixed with said second signal ($F_2$), selecting a signal at a desired frequency from the second mixer as the second intermediate frequency signal ($IF_2$) from the second mixer; and conveying the second intermediate frequency signal ($IF_2$) to a demodulator for demodulation.

According to a second aspect of the present invention there is provided a method of generating signals of different frequencies required in transmission in a digital radio telephone for operation in at least two different frequency bands, characterized by, producing a first signal ($F_1$) of a first frequency and producing a second signal ($F_2$) of a second frequency, mixing said first and second signals ($F_1$ and $F_2$), selecting a signal of a desired frequency from the mixer as the transmission signal (FTX); and conveying the transmission signal (FTX) to an antenna for transmission.

An advantage of a method in accordance with the present invention is that the frequencies required in different mobile phone systems can be produced with essentially the same circuit. The method enables the required frequencies for two systems operating on different frequencies to be generated with substantially the same circuit by selecting suitable frequencies from the mixing results of the mixers used. The same circuit can be used in a telephone operating in two different systems. Only the filters of the circuit are different for different systems, because the frequencies in use will not be the same. Thus the number of parts to replace is very low such that when the RF parts comprise several hundred components, the number of the filters will remain below ten.

In one embodiment of the invention two synthesizers and a reference oscillator are used to generate the frequencies. The second synthesizer generates a first a frequency with a magnitude substantially lower than the frequency band of the system operating on lower frequencies, and the first synthesizer generates a frequency with a magnitude between the first system and the second system which operates on higher frequencies. The frequencies produced by the synthesizers are on the receiving side supplied to the mixers, where the intermediate frequencies for the receiver are generated, and on the transmitting side to a mixer, where the transmission frequency is generated. The mixers generate several different mixing results, and when the frequencies generated by the synthesizers are selected in a suitable way as was mentioned above, it is possible to obtain the frequencies required by two different systems when the selection among the mixing results is made in a suitable way.

BRIEF DESCRIPTION OF THE DRAWINGS

An embodiment of the invention is described in more detail, by way of example, with reference to the accompanying FIGURE which shows only those blocks which are important in order to understand the method.

DETAILED DESCRIPTION OF THE INVENTION

Figure 1:
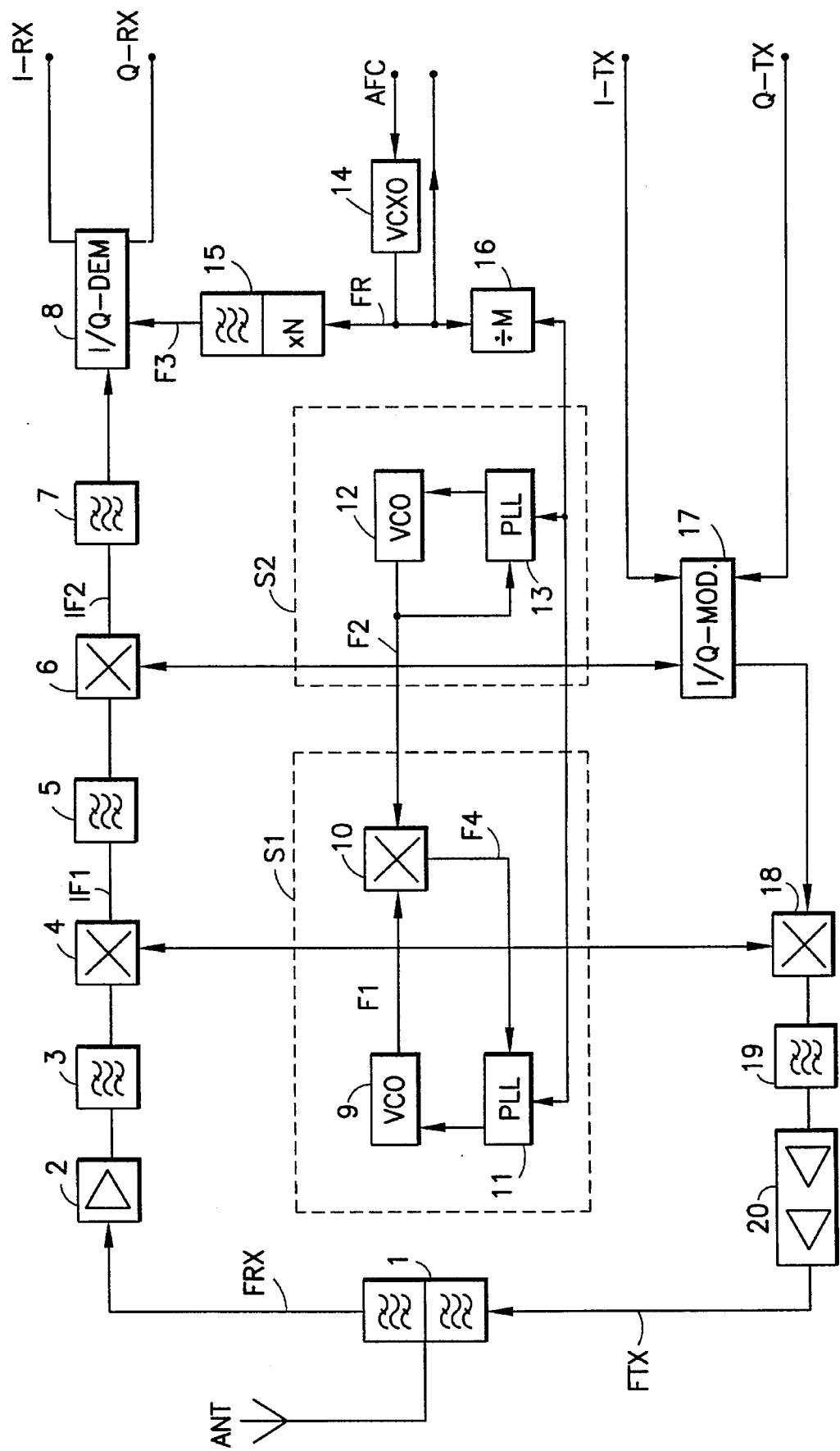

In connection with the description frequency values are mentioned, which are selected to generate frequencies used in the GSM and PCN systems, for example. These systems use the frequency bands:

| GSM: | reception | 890–915 MHz |
| --- | --- | --- |
| | transmission | 935–960 MHz |
| PCN: | reception | 1710–1785 MHz |
| | transmission | 1805–1880 MHz |

The figure shows a simplified block diagram of the RF parts. The diagram shows two synthesizers S1 and S2. The first synthesizer S1 consists of a phase locked loop, of which as separate blocks are shown the voltage controlled oscillator 9 and the block 11 containing a filter, an amplifier, a frequency divider and a phase detector of the phase locked loop, and of the mixer 10, and it operates on the frequency band F1 selected within the 1300 MHz frequency band for the frequencies of GSM and PCN. The second synthesizer S2 consists of a phase locked loop, of which as blocks are shown the voltage controlled oscillator 12 and the block 13 containing a filter, an amplifier, a frequency divider and the phase detector of the phase locked loop, and it operates on the 400 MHz frequency band F2. The reference frequency for the synthesizers S1 and S2 is obtained from the reference oscillator 14 via the divider 16. To the frequency divider (not shown) of the block 11 of the synthesizer S1 is supplied a frequency F4 of about 900 MHz, which is obtained as the difference of the frequency F1 (about 1300 MHz) supplied by the mixer 10 of the synthesizer S1 and the frequency F2 (about 400 MHz) supplied by the synthesizer S2. It is previously known to use this kind of mixing in the feedback loop, and the use of it is not mandatory in this invention, but it will depend on the frequency whether it will be advantageous to use the mixer 10 to decrease the frequency supplied to the frequency divider. If the frequency supplied to the frequency divider is high, then the divider total will increase and thus increases the noise level of the synthesizer signal, and therefore it is advantageous to decrease the frequency with the aid of the mixer. The third local oscillator frequency F3 is formed from the reference frequency FR obtained with the reference oscillator 14, advantageously a voltage controlled crystal oscillator, the reference frequency being multiplied in a multiplier and filtered with the filter 15 of the multiplier stage. The reference frequency FR is multiplied by a factor, which may be for example 1, 2 or 4. The reference frequency FR can be e.g. 26 or 52 MHz and it is supplied to the RF parts and also directly from the reference oscillator 14 to the logic of the radio telephone.

During reception the signal to be received at the receiving frequency FRX is directed from the antenna ANT via the duplexer filter 1, from which it is supplied via the buffer 2 and the receiver RF filter 3 to the mixer 4, where it is mixed with the first mixing frequency F1 supplied by the synthesizer S1 to form the first intermediate frequency IF1. A relatively high frequency ie used as the first intermediate frequency IF1 in order to avoid spurious response frequencies depending on the wide frequency band of PCN in transmission and reception at 75 MHz. A high intermediate frequency is an advantage also in GSM, because then the RF filters, such as ceramic filters, will be smaller and more economical. From the mixer 4 the signal is supplied through the first intermediate filter 5 to the second mixer 6, where it is mixed with the second mixing frequency F2 supplied by the synthesizer S2 to generate the second intermediate frequency IF2. From the second mixer 6 the signal is supplied through the second intermediate filter 7 to the demodulator 8, preferably an I/Q-modulator, which also receives the local oscillator frequency F3.

The signal to be transmitted is directed from the modulator 17, preferably an I/Q-modulator receiving in addition to the signal to be transmitted also the second mixing frequency F2 as the modulator carrier signal, to the mixer 18, where the signal is mixed to the transmitting frequency FTX with the first mixing frequency F1. From the mixer 18 the signal is supplied through the transmitter filter 19 to the power amplifier 20, from which the amplified signal is directed through the duplexer filter i to the antenna ANT.

In the GSM and PCN systems the first and the second intermediate frequency and the transmitting frequency are different frequencies. In the method according to the invention the frequencies for both systems can be generated using the circuit according to the FIGURE by suitably selecting the mixing results of the mixers 4, 6 and 18. Thus the frequencies for both systems are selected as follows:

| GSM: | first intermediate frequency | $IF1 = F1 - FRX$ |
|---|---|---|
| | second intermediate frequency | $IF2 = F2 - IF1$ |
| | | $\therefore IF2 = 52$ MHz |
| | transmitting frequency | $FTX = F1 - F2$ |
| PCN: | first intermediate frequency | $IF1 = FRX - F1$ |
| | second intermediate frequency | $IF2 = IF1 - F2$ |
| | | $\therefore IF2 = 104$ MHz |
| | transmitting frequency | $FTX = F1 + F2$ | where F1 and F2 are the first and the second mixing frequencies and FRX is the transmitting frequency. The device to generate the frequencies of a digital radiotelephone both for the GSM and the PCN systems can be realized with an arrangement according to the FIGURE. Thus it is possible to use the same RF parts in both systems, if only the filters 1, 3, 5, 7, 15 and 19 are replaced to be suitable for each system. Further it might be advantageous to use as the power amplifier 20 a power amplifier optimized for each frequency band (900 MHz, 1800 MHz) regarding efficiency and price, whereby the amplifier may be an integrated circuit, a thick film hybrid or an amplifier realized with discrete components. It might also be advantageous to design some adapting circuits as narrow band circuits, whereby they require different components for each frequency band.

A method in accordance with the invention decreases the product development cost and time for the RF parts, as the same RF parts can be used in two different systems. It will be more profitable to realize the RF parts as integrated circuits, because the same circuits can be used in several systems, and thus the size of the production batches will increase and the unit cost of the circuits will decrease, because the development and production cost of the integrated circuits will decrease. Moreover, the cost of investment into production will decrease, as the same production line can be used for the manufacture of telephones for both systems (GSM, PCN), whereby only slight modifications will be requited in the assembly and test programs.

In view of the foregoing it will be clear to a person skilled in the art that modifications may be incorporated without departing from the scope of the present invention.

I claim:

1. A method of selectively operating a digital radio telephone in one of at least two different frequency bands, comprising the steps of:

performing an initial step of initially selecting the radio telephone to operate in a selected one of the at least two different frequency bands by installing a plurality of frequency filter means individual ones of which are selected in accordance with the selected one of the at least two different frequency bands;

producing a first signal ($F_1$) of a first frequency and producing a second signal ($F_2$) of a second frequency that differs from the first frequency;

when receiving with the digital radio telephone, conveying a received signal (FRX) to a first mixer, wherein the received signal is mixed with the first signal ($F_1$);

when the radio telephone is initially selected to operate in a first one of the at least two frequency bands, the step of initially selecting provides a first frequency filter means having an input coupled to an output of the first mixer, the first frequency filter means having a predetermined filtering characteristic for selecting a signal at a first desired frequency as a first intermediate frequency signal ($IF_1$);

when the radio telephone is initially selected to operate in a second one of the at least two frequency bands, the step of initially selecting provides a second frequency filter means having an input coupled to the output of the first mixer, the second frequency filter means having a predetermined filtering characteristic for selecting a signal at a second desired frequency as the first intermediate frequency signal ($IF_1$);

conveying the first intermediate frequency signal ($IF_1$) to a second mixer, wherein the first intermediate frequency signal ($IF_1$) is mixed with the second signal ($F_2$);

when the radio telephone is initially selected to operate in the first one of the at least two frequency bands, the step of initially selecting provides a third frequency filter means having an input coupled to an output of the second mixer, the third frequency filter means having a predetermined filtering characteristic for selecting a signal at a third desired frequency as a second intermediate frequency signal ($IF_2$);

when the radio telephone is initially selected to operate in the second one of the at least two frequency bands, the step of initially selecting provides a fourth frequency filter means having an input coupled to the output of the second mixer, the fourth frequency filter means having a predetermined filtering characteristic for selecting a signal at a fourth desired frequency as the second intermediate frequency signal ($IF_2$); and conveying the second intermediate frequency signal ($IF_2$) to a demodulator for demodulation; wherein the first frequency filter means is provided, when the radio telephone is initially selected to operate on a lower one of the at least two frequency bands, such that the first intermediate frequency signal ($IF_1$) has a frequency that is a difference between the frequency of the first signal ($F_1$) and the frequency of the received signal (FRX), wherein the frequency of the received signal is less than the frequency of the first signal; wherein the second frequency filter means is provided, when the radio telephone is initially selected to operate on a higher one of the at least two frequency bands, such that the first intermediate frequency signal ($IF_1$) has a frequency that is a difference between the frequency of the received frequency (FRX) and the frequency of the first signal ($F_1$), wherein the frequency of the received signal is greater than the frequency of the first signal; wherein the third frequency filter means is provided, when the radio telephone is initially selected to operate on the lower one of the at least two frequency bands, such that the second intermediate frequency ($IF_2$) has a frequency that is a difference between the frequency of the second signal ($F_2$) and the frequency of the first intermediate frequency signal ($IF_1$), wherein the frequency of the second signal is greater than the frequency of the first intermediate signal, and wherein the fourth frequency filter means is provided, when the radio telephone is initially selected to operate on the higher one of the at least two frequency bands, such that the second intermediate frequency ($IF_2$) has a frequency that is a difference between the frequency of the first intermediate frequency signal ($IF_1$) and the frequency of the second signal ($F_2$), wherein the frequency of the first intermediate frequency signal is greater than the frequency of the second signal;

when transmitting with the digital radio telephone, mixing the first and second signals ($F_1$ and $F_2$) with a third mixer;

when the radio telephone is initially selected to operate in the first one of the at least two frequency bands, the step of initially selecting provides a fifth frequency filter means having an input coupled to an output of the third mixer, the fifth frequency filter means having a predetermined filtering characteristic for selecting a signal at a fifth desired frequency as a transmission signal (FTX);

when the radio telephone is initially selected to operate in the second one of the at least two frequency bands, the step of initially selecting provides a sixth frequency filter means at the output of the third mixer, the sixth frequency filter means having a predetermined filtering characteristic for selecting a signal at a sixth desired frequency as the transmission signal (FTX); and conveying the transmission signal (FTX) to an antenna for transmission; wherein the fifth frequency filter means is provided, when the radio telephone is initially selected to operate on the lower one of the at least two frequency bands, such that the transmission signal (FTX) has a frequency that is a difference between the frequency of the first signal ($F_1$) and the frequency of the second signal ($F_2$); and wherein the sixth frequency filter means is provided, when the radio telephone is initially selected to operate on the higher one of the at least two frequency bands, such that the transmission signal (FTX) has a frequency that is the sum of the frequency of the first signal ($F_1$) and the frequency of the second signal ($F_2$).

2. A method as claimed in claim 1, wherein when the radio telephone is initially selected to operate on the lower one of the least two frequency bands the radio telephone functions as a GSM-telephone (Group Special Mobile), and when the radio telephone is initially selected to operate on the higher one of the at least two frequency bands the radio telephone functions as a PCN-telephone (Personal Communications Network).

* * * * *